United States Patent
Familia et al.

(10) Patent No.: US 9,866,225 B2
(45) Date of Patent: *Jan. 9, 2018

(54) DIGITAL PHASE-LOCKED LOOP SUPPLY VOLTAGE CONTROL

(71) Applicant: Intel Corporation, Santa Clara, CA (US)

(72) Inventors: Noam Familia, Modiin (IL); Avigdor Saksonov, Jerusalem (IL); Eyal Fayneh, Givatyim (IL); Joseph Shor, Tel Mond (IL)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/161,511

(22) Filed: May 23, 2016

(65) Prior Publication Data

US 2016/0269036 A1   Sep. 15, 2016

Related U.S. Application Data

(63) Continuation of application No. 14/490,358, filed on Sep. 18, 2014, now Pat. No. 9,350,365.

(51) Int. Cl.
*H03L 7/099*   (2006.01)
*H03L 7/093*   (2006.01)
(Continued)

(52) U.S. Cl.
CPC ............ *H03L 7/0991* (2013.01); *H03B 5/10* (2013.01); *H03K 3/0315* (2013.01); *H03L 5/00* (2013.01);
(Continued)

(58) Field of Classification Search
CPC ......... H03L 7/0991; H03L 7/099; H03L 5/00; H03L 7/093; H03L 7/18; H03L 7/095; H03L 7/0995; H03L 7/091; H03B 5/10
(Continued)

(56) References Cited

U.S. PATENT DOCUMENTS 6,594,330 B1   7/2003   Wilson
8,130,048 B2 *  3/2012   Kobayashi ............. H03K 5/133
                                                         327/261
(Continued)

FOREIGN PATENT DOCUMENTS

TW    201622358 A    6/2016
WO    WO-2016044057 A1    3/2016

OTHER PUBLICATIONS

"U.S. Appl. No. 14/490,358, Non Final Office Action dated Aug. 17, 2015", 8 pgs.
(Continued)

*Primary Examiner* — Arnold Kinkead
(74) *Attorney, Agent, or Firm* — Schwegman Lundberg & Woessner, P.A.

(57) ABSTRACT

Some embodiments include apparatuses and methods having a digitally controlled oscillator (DCO) in a digital phase-locked loop (PLL) and a control loop. The DCO can generate an output signal having a frequency based on a value of a digital information. The control loop can adjust a value of a supply voltage of the DCO based on the value the digital information. Additional apparatuses and methods are described.

18 Claims, 10 Drawing Sheets

(51) Int. Cl.
*H03L 7/083* (2006.01)
*H03K 3/03* (2006.01)
*H03L 7/18* (2006.01)
*H03L 7/095* (2006.01)
*H03L 5/00* (2006.01)
*H03B 5/10* (2006.01)
*H03L 7/091* (2006.01)

(52) U.S. Cl.
CPC .............. *H03L 7/083* (2013.01); *H03L 7/091* (2013.01); *H03L 7/093* (2013.01); *H03L 7/095* (2013.01); *H03L 7/099* (2013.01); *H03L 7/0995* (2013.01); *H03L 7/18* (2013.01)

(58) Field of Classification Search
USPC ...................... 331/1 A, 185, 183, 175, 16, 17
See application file for complete search history.

(56) References Cited

U.S. PATENT DOCUMENTS

| | | |
|---|---|---|
| 9,350,365 B2 | 5/2016 | Familia et al. |
| 2005/0184772 A1 | 8/2005 | Wilson et al. |
| 2007/0159263 A1 | 7/2007 | Chou et al. |
| 2009/0108890 A1 | 4/2009 | Fratti et al. |
| 2009/0141825 A1 | 6/2009 | Jacobsson et al. |
| 2011/0069792 A1 | 3/2011 | Chen |
| 2012/0223778 A1 | 9/2012 | Shin et al. |
| 2013/0169457 A1* | 7/2013 | Helio .................... G04F 10/005 341/120 |
| 2013/0249611 A1* | 9/2013 | Vandepas ................ H03L 1/022 327/159 |
| 2013/0307631 A1* | 11/2013 | Lotfy ................... H03K 3/0315 331/34 |
| 2014/0240053 A1 | 8/2014 | Huang et al. |
| 2016/0087641 A1 | 3/2016 | Familia et al. |

OTHER PUBLICATIONS

"U.S. Appl. No. 14/490,358, Notice of Allowance dated Feb. 26, 2016", 5 pgs.
"U.S. Appl. No. 14/490,358, Response filed Nov. 16, 2015 to Non Final Office Action dated Aug. 17, 2015", 8 pgs.
"International Application Serial No. PCT/US2015/049427, International Search Report dated Dec. 30, 2015", 3 pgs.
"International Application Serial No. PCT/US2015/049427, Written Opinion dated Dec. 30, 2015", 9 pgs.
"Taiwanese Application Serial No. 104126251, Office Action dated Jun. 24, 2016", With English Translation, 10 pgs.
"Taiwanese Application Serial No. 104126251, Office Action dated Nov. 14, 2016", With English Translation, 8 pgs.
"Taiwanese Application Serial No. 104126251, Response filed Sep. 23, 2016 to Office Action dated Jun. 24, 2016", With English Translation of Claims, 18 pgs.

* cited by examiner

DIGITAL PHASE-LOCKED LOOP SUPPLY VOLTAGE CONTROL

CROSS-REFERENCE TO RELATED APPLICATION

This application is a continuation of U.S. patent application Ser. No. 14/490,358, filed Sep. 18, 2014, which is incorporated by reference herein in its entirety.

TECHNICAL FIELD

Embodiments described herein pertain to signal generators. Some embodiments relate to phase-locked loop.

BACKGROUND

Many electrical devices, such as processors and memory devices, often have a phase-locked loop (PLL) unit to generate one or more tuning (e.g., clock) signals for use in operations in these devices. The PLL unit also operates to keep the timing signals within a certain specification to ensure accuracy in the device operations. Some situations may cause the timing signals to deviate from their specification if the PLL unit in these devices is improperly controlled. This may result in device operational failure.

DETAILED DESCRIPTION

Figure 1:
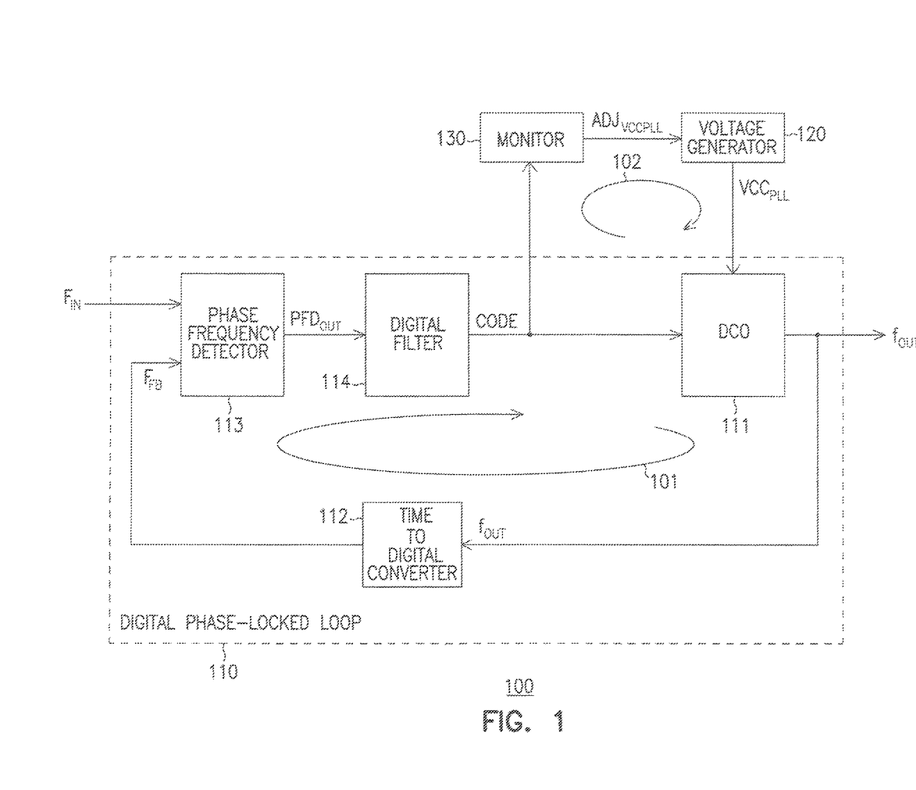
FIG. 1 shows a block diagram of an apparatus including a digital PLL, a voltage generator, and a monitor, according to some embodiments described herein.

FIG. 1 shows a block diagram of an apparatus 100 including a digital phase-locked loop (PLL) 110, a voltage generator 120, and a monitor 130, according to some embodiments described herein. PLL 110 can receive a signal (e.g., a reference clock signal) $f_{REF}$ and generate a signal (e.g., output clock signal) $f_{OUT}$. The frequency of the $f_{OUT}$ signal may be the same as (or a multiple of) the frequency of the $f_{REF}$ signal. The $f_{OUT}$ signal may be used as a timing signal (e.g., clock signal) in other components of an integrated circuit (IC) chip that includes PLL 110.

PLL 110 can generate information CODE to control the frequency of the $f_{OUT}$ signal. Information CODE is digital information (e.g., a digital control word) that can include a number of bits. Information CODE can be used as a fine tuning code for PLL 110. PLL 110 can adjust the value of information CODE to keep the frequency of the $f_{OUT}$ signal within a specified (e.g., predetermined) value relative to the frequency of the $f_{REF}$ signal.

PLL 110 can be deemed to be locked (e.g., to be in a locked state) when the phase (e.g., a rising edge) of the $f_{OUT}$ signal matches the phase (e.g., a rising edge) of the $f_{REF}$ signal within a specified (e.g., predetermined) value. PLL 110 can be deemed to be unlocked (e.g., to be in an unlocked state) when the phase of the $f_{OUT}$ signal and the phase of the $f_{OUT}$ signal is not within the specified value.

As mentioned above, the $f_{OUT}$ signal may be used as a timing signal in other components (not shown in FIG. 1). If PLL 110 is unlocked, operations in the other components may fail. Thus, in order to maintain proper operations in components that use the $f_{OUT}$ signal, PLL 110 can adjust (e.g., automatically adjust) the value of information CODE to keep PLL 110 locked.

As shown in FIG. 1, PLL 110 can include a DCO 111 to generate the $f_{OUT}$ signal. PLL 110 can include a control loop 101 having a time-to-digital converter (TDC) 112, a phase frequency detector (PFD) 113, and a digital filter 114. Control loop 101 can adjust the value of information CODE based on timing relationship (e.g., phases) between the $f_{REF}$ and $f_{OUT}$ signals.

TDC 112 receives the $f_{OUT}$ signal and generates information $F_{FB}$, which is a digital representation of the $f_{OUT}$ signal. For example, TDC 112 may measure the values of the $f_{OUT}$ signal at different time intervals (e.g., time intervals corresponding to a cycle of the $f_{OUT}$ signal). Then, TDC 112 may generate information $F_{FB}$ that includes a number of bits to represent digital information the measured valued.

PFD 113 compares information $F_{IN}$ and $F_{FB}$ and generates information $PFD_{OUT}$, which is result that represents a difference in values (e.g., error) between $F_{IN}$ and $F_{FB}$. Information $F_{IN}$ signal is a digital representation of the $f_{REF}$ signal that can be generated by, for example, a TCD 112. Since information $F_{IN}$ and $F_{FB}$ are digital representations of the $f_{REF}$ and $f_{OUT}$ signals, respectively, the value of information $PFD_{OUT}$ also represents a phase difference (e.g., phase error) between the $f_{OUT}$ and $f_{REF}$ signals.

Digital filter 114 receives information $PFD_{OUT}$ and generates information CODE based on the value of information $PFD_{OUT}$. Since information $PFD_{OUT}$ represents the difference between information $F_{IN}$ and $F_{FB}$ signals (which are digital representations of the $f_{REF}$ and $f_{OUT}$ signals, respectively), adjusting the value of information CODE can also adjust the phase difference between the $f_{REF}$ and $f_{OUT}$ signals. Initially (e.g., when PLL 110 is powered up), the $f_{OUT}$ and $f_{REF}$ signals may be out of phase (e.g., the phases of the $f_{OUT}$ and $f_{REF}$ signals are not within a specified value).

Thus, PLL 110 initially may not be locked. When PLL 110 is not locked, control loop 101 operates to adjust the value of information CODE in order to adjust the frequency of the $f_{OUT}$ signal until PLL is locked. After PLL 110 is locked, control loop 101 also operates as a digital feedback loop to keep PLL 110 to remain locked.

Voltage generator 120 and monitor 130 may form a control loop (e.g., analog feedback loop) 102 to prevent PLL 110 from potentially becoming unlocked in some situations (as described in more detail with reference to FIG. 2, FIG. 3, and FIG. 4). Voltage generator 120 generates a voltage $VCC_{PLL}$ and provides it to PLL 110. PLL 110 may use voltage $VCC_{PLL}$ as its supply voltage. The value of voltage $VCC_{PLL}$ can be based on a value of information $ADJ_{VCCPLL}$ generated by monitor 130. For example, voltage $VCC_{PLL}$ can have one value based on a value of information $ADJ_{VCCPLL}$ and another value based on another value of information $ADJ_{VCCPLL}$.

Monitor 130 can operate to monitor (e.g., continuously monitor) the value of information CODE and generate information $ADJ_{VCCPLL}$ based on the value of information CODE. Information $ADJ_{VCCPLL}$ can include digital information. If the value of information CODE approaches a certain value that may potentially cause PLL 110 to unlock (as described in more detail with reference to FIG. 2, FIG. 3, and FIG. 4), monitor 130 can adjust the value of information $ADJ_{VCCPLL}$ in order to cause voltage generator 120 to change (e.g., decrease or increase) the value of voltage $VCC_{PLL}$. In response to the change in voltage $VCC_{PLL}$, control loop 101 of PLL 110 operates to bring the value of information CODE back to a value (e.g., a safe value) to prevent PLL 110 from potentially becoming unlocked.

Figure 2:
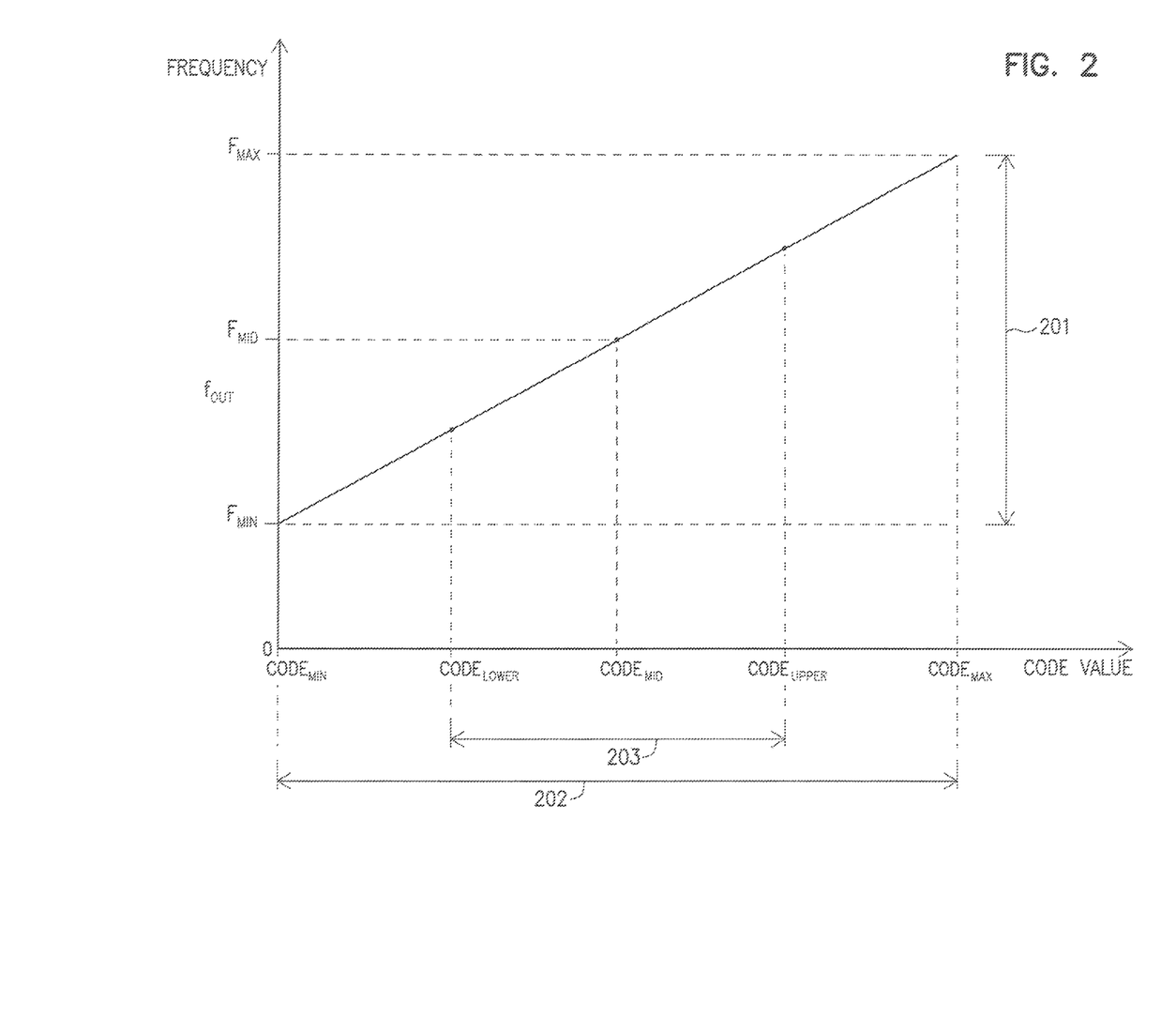
FIG. 2 is a graph showing a relationship between a band frequency range of an output signal of the PLL of FIG. 1 and a banding range including a value range of digital information generated by the PLL of FIG. 1, according to some embodiments described herein.

FIG. 2 is a graph showing a relationship between a band frequency range 201 of the $f_{OUT}$ signal and a banding range 202 including a value range 203 of the information CODE of FIG. 1, according to some embodiments described herein. As shown in FIG. 2, band frequency range 201 of the $f_{OUT}$ signal can include frequencies from a frequency $f_{MIN}$ (e.g., a minimum frequency) to a frequency $f_{MAX}$ (e.g., a maximum frequency). When PLL 110 is locked, the frequencies in band frequency range 201 can be acceptable (e.g., predetermined) frequencies at which the $f_{OUT}$ signal may have without causing PLL 110 to unlock. PLL 110 can deemed to be unlocked if the frequency of the $f_{OUT}$ signal is outside band frequency range 201. PLL 110 can be deemed to be locked (or remained locked) if the frequency of the $f_{OUT}$ signal is within band frequency range 201. In operation, control loops 101 and 102 (FIG. 1) can operate to adjust the value of information CODE to keep the frequency of the $f_{OUT}$ signal within band frequency range 201 (FIG. 2) in order to keep PLL 110 locked (or to prevent PLL 110 from becoming unlocked).

As shown in FIG. 2, banding range 202 of information CODE can include values from a value $CODE_{MIN}$ to a value $CODE_{MAX}$. The values $CODE_{MIN}$ and $CODE_{MAX}$ can be minimum and maximum values, respectively, of information CODE. For example, if information CODE has nine bits, the value $CODE_{MIN}$ can be binary value of 000000000 (or 0 in decimal value), and the value $CODE_{MAX}$ can be a binary value of 111111111 (or 511 in decimal value). FIG. 2 also shows a value $CODE_{MID}$, which can be approximately a midpoint between values of $CODE_{MIN}$ and $CODE_{MAX}$.

The $f_{OUT}$ signal can have the frequency $f_{MIN}$ when information CODE has the value $CODE_{MIN}$, the frequency $f_{MAX}$ when information CODE has the value $CODE_{MAX}$, or the frequency $f_{MID}$ when information CODE has the value $CODE_{MID}$. The frequency $f_{MID}$ can be approximately a midpoint between the frequencies $f_{MIN}$ and $f_{MAX}$.

Value range 203 can include values from a value $CODE_{LOWER}$ to a value $CODE_{UPPER}$. The values $CODE_{LOWER}$ and $CODE_{UPPER}$ can corresponding to lower and upper limits, respectively, of value range 203. As shown in FIG. 2, the value $CODE_{LOWER}$ is greater than the value $CODE_{MIN}$. The value $CODE_{UPPER}$ is less than the value $CODE_{MAX}$.

Value range 203 can be considered as a monitored range (e.g., a safe range) within banding range 202. If the value of information CODE is outside value range 203 but within banding range 202, PLL 110 can still be deemed to be locked but it may potentially become unlocked in some situations. For example, if the supply voltage, operating temperature, or both of PLL 110 change, PLL 110 may potentially become unlocked if the value of information CODE is between values $CODE_{MIN}$ and $CODE_{LOWER}$ or between values $CODE_{UPPER}$ and $CODE_{MAX}$. Thus, in operation (e.g., when PLL 110 is locked), the value of information CODE can be monitored by monitor 130. If the value of information CODE is outside value range 203, monitor 130 can cause voltage generator 120 to change the value of voltage $VCC_{PLL}$ (e.g., change the value of voltage $VCC_{PLL}$ on-the-fly) in order to allow PLL 110 to bring the value of information CODE back within value range 203. This prevents PLL 110 from potentially becoming unlocked.

Figure 3:
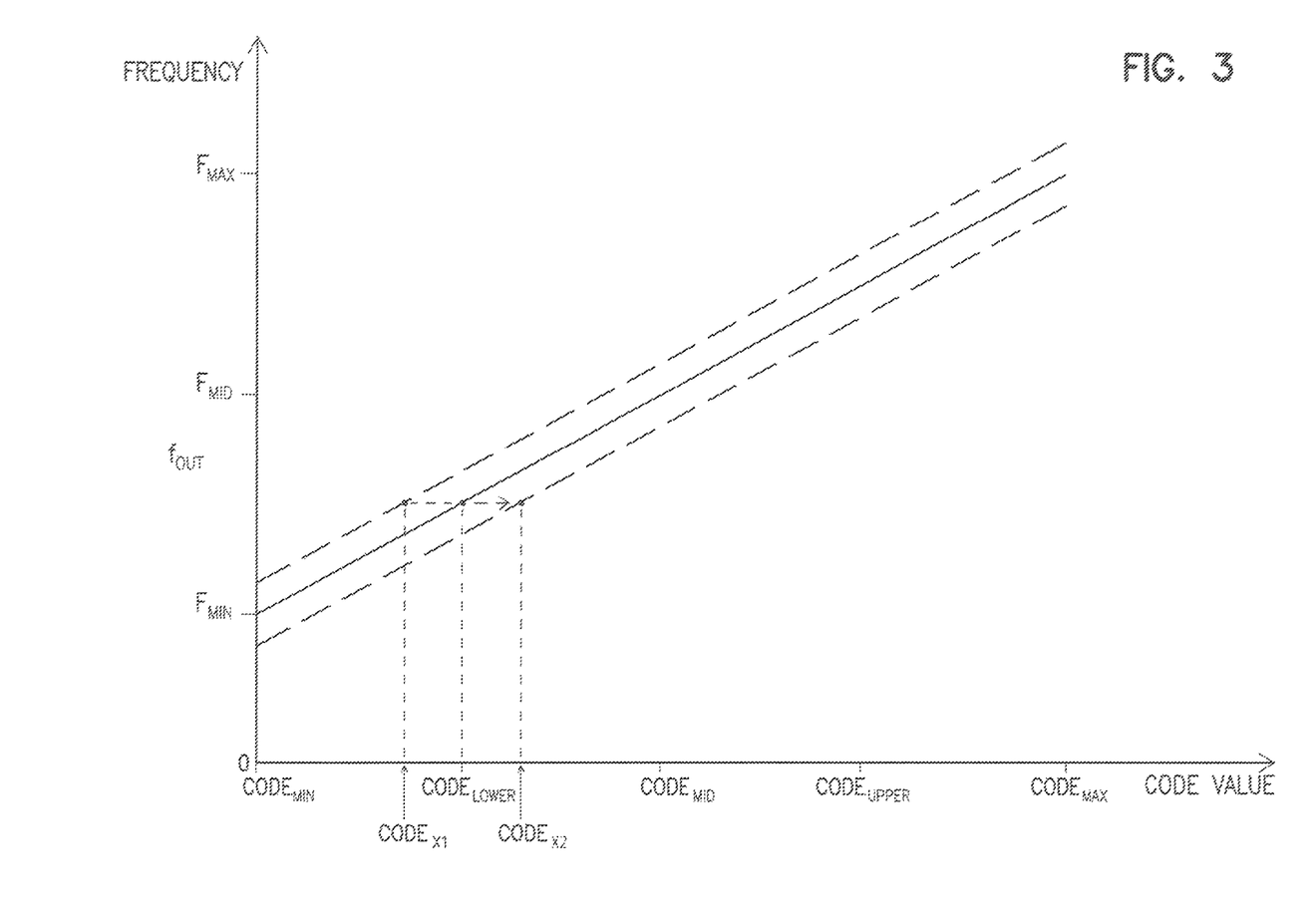
FIG. 3 is a graph showing an example situation where the value of the digital information of FIG. 2 is adjusted if it is less than a lower limit of a value range, according to some embodiments described herein.

FIG. 3 is a graph showing an example situation where the value of information CODE is adjusted if it is less than the lower limit (e.g., $CODE_{LOWER}$) of value range 203, according to some embodiments described herein. In the example shown in FIG. 3, information CODE has a value $CODE_{X1}$, which is less than the value $CODE_{LOWER}$. When monitor 130 (FIG. 1) detects this situation, it adjusts the value of information $ADJ_{VCCPLL}$ to cause voltage generator 120 to change (e.g., to decrease) the value of voltage $VCC_{PLL}$. In response to the change in the value of voltage $VCC_{PLL}$, control loop 101 of PLL 110 operates to bring the value of information CODE from the value $CODE_{X1}$ (outside value range 203) to value $CODE_{X2}$ (inside value range 203) to prevent PLL 110 from potentially becoming unlocked.

Figure 4:
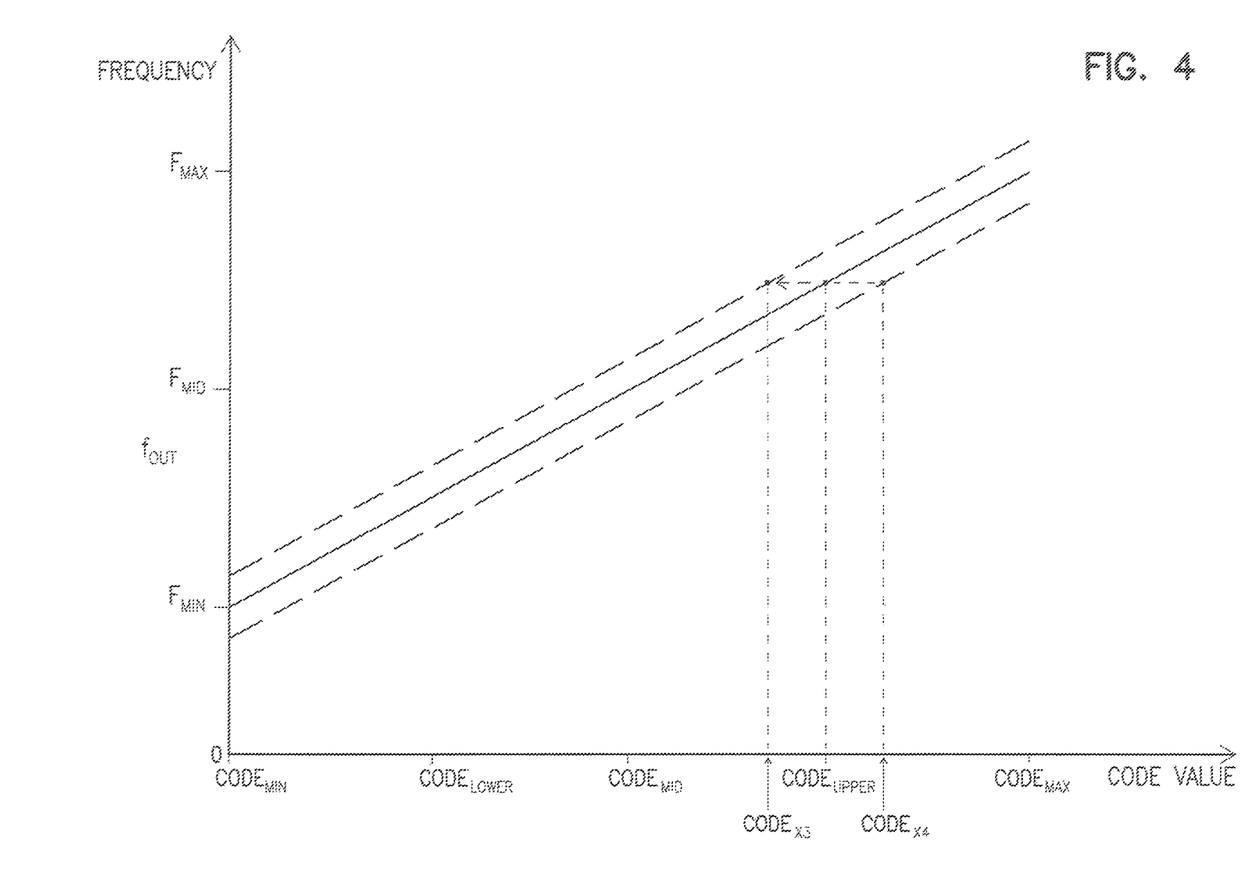
FIG. 4 is a graph showing an example situation where the value of the digital information of FIG. 2 is adjusted if it is greater than an upper limit of the value range, according to some embodiments described herein.

FIG. 4 is a graph showing an example situation where the value of information CODE is adjusted if it is greater than the upper limit (e.g., $CODE_{UPPER}$) of value range 203, according to some embodiments described herein. In the example shown in FIG. 4, information CODE has a value $CODE_{X4}$, which is greater than the value $CODE_{UPPER}$. When monitor 130 (FIG. 1) detects this situation, it adjusts the value of information $ADJ_{VCCPLL}$ to cause voltage generator 120 to change (e.g., to increase) the value of voltage $VCC_{PLL}$. In response to the change in the value of voltage $VCC_{PLL}$, control loop 101 of PLL 110 operates to bring the value of information CODE from the value $CODE_{X4}$ (outside value range 203) to value $CODE_{X3}$ (inside value range 203) to prevent PLL 110 from potentially becoming unlocked.

Figure 5:
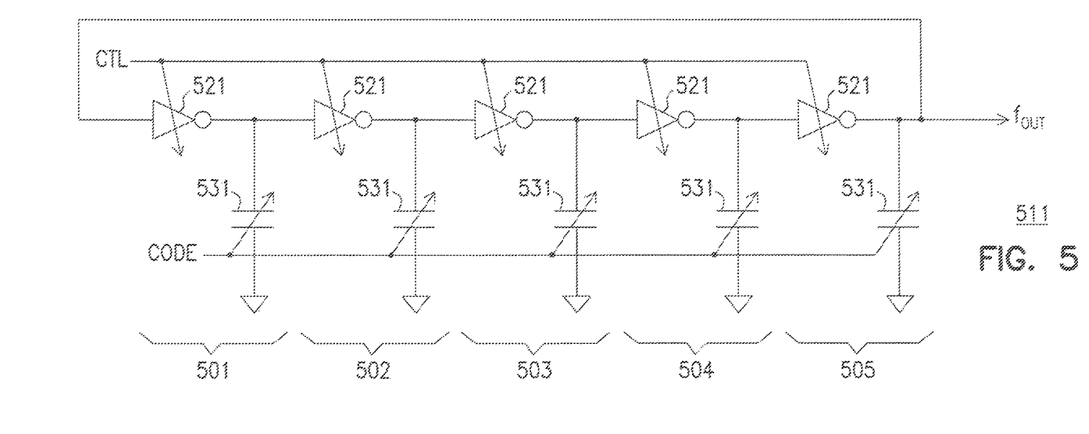
FIG. 5 shows a simplified schematic diagram of a digitally control oscillator (DCO), according to some embodiments described herein.

FIG. 5 shows a simplified schematic diagram of a DCO 511, according to some embodiments described herein. DCO 511 can be used an example for DCO 111 of PLL 110 of FIG. 1. As shown in FIG. 5, DCO 511 can include stages 501 through 505 coupled in ring arrangement to operate as a ring oscillator. Stages 501 through 505 can include inverters 521 and capacitive loads 531. Each of capacitive loads 531 can include one or more capacitors. FIG. 5 shows DCO 511 including five stages 501 through 505 and one inverter (one of inverters 521) in each stage as an example. The number of stages and the number of inverters in each stage can vary.

Inverters 521 can be controlled by information CTL, which is digital information having a number of bits. Information CTL in FIG. 5 can be used as a coarse tuning code for DCO 511. Capacitive loads 531 can be digitally controlled by information CODE which can correspond to information CODE described above with reference to FIG. 1 through FIG. 4. Information CODE can be used as a fine tuning code for DCO 511.

As mentioned above, DCO 511 can be used an example for DCO 111 of PLL 110 of FIG. 1. For example, in operation, before PLL 110 is locked, information CTL can be provided with different values (e.g., using binary search technique) to add or subtract the number of inverters in one or more of stages 501 through 505 in order to tune the frequency of the $f_{OUT}$ signal until it is near a target frequency (near band frequency range 201 in FIG. 2). After the frequency of the $f_{OUT}$ signal is near a target frequency, the values (e.g., values between information $CODE_{MIN}$ and information $CODE_{MAX}$ in FIG. 2) of information CODE can be selected to add or subtract the number of capacitors in one or more of capacitive loads 531 in order to tune the frequency of the $f_{OUT}$ signal until PLL 110 is locked (until the frequency of the $f_{OUT}$ signal is within band frequency range 201 in FIG. 2).

The value of information CLT may remain unchanged (e.g., may not be adjusted) after the PLL 110 is locked. When PLL 110 is locked, the value of information CODE may be adjusted to adjust (e.g., increase or decrease) the values of capacitive loads 531 (e.g., by adding or subtracting capacitors in capacitive loads 531) in order keep the frequency of the $f_{OUT}$ signal at the target frequency (e.g., a frequency within band frequency range 201 of FIG. 2), thereby preventing PLL 110 from becoming unlocked.

Figure 6:
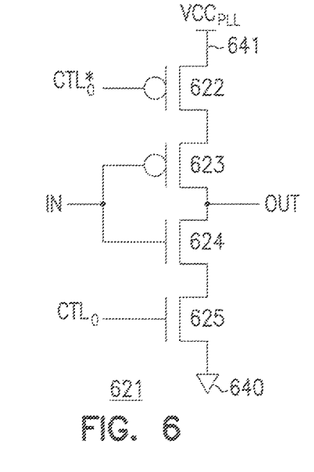
FIG. 6 shows a schematic diagram of an inverter that can be included in the DCO of FIG. 5, according to some embodiments described herein.

FIG. 6 shows a schematic diagram of an inverter 621 that can be included in DCO 511 of FIG. 5, according to some embodiments described herein. Inverter 621 can be included as an inverter in each of stages 501 through 505 in DCO 511 of FIG. 5. As shown in FIG. 6, inverter 621 can include transistors (e.g., p-channel transistors) 622 and 623, transistors (e.g., n-channel transistors) 624 and 625, an input IN and an output OUT. Input IN can be coupled to an output of another inverter (e.g., a preceding inverter) in a ring oscillator. Output OUT can be coupled to an input of another inverter (e.g., succeeding inverter) in the ring oscillator. Transistor 622 can be controlled by a signal $CTL*_0$. Transistor 625 can be controlled by a signal $CTL_0$. Signal $CTL_0$ can include a value of a bit among bits of information CTL. Signals $CTL_0$ and $*CTL_0$ can be inverted versions (e.g., complements) of each other.

As shown in FIG. 6, transistors 622, 623, 624, and 625 can be coupled between nodes (e.g., supply nodes) 640 and 641. Node 640 can be coupled to ground. Node 641 can receive a voltage $VCC_{PLL}$ (e.g., supply voltage), which can be provided by a voltage generator, such as voltage generator 120 of FIG. 1. As described above with reference to FIG. 1 through FIG. 4, voltage $VCC_{PLL}$ provided by generator 120 can be adjusted by a monitoring the value of information CODE using a monitor, such as monitor 130 of FIG. 1.

As described above with reference to FIG. 5, tuning the frequency of the $f_{OUT}$ signal to a target frequency can include adding or subtracting the number of inverters in one or more of stages 501 through 505. In FIG. 6, when inverter 621 is included in stages 501 through 505 in FIG. 5, adding an inverter in a stage among stages 501 through 505 can include turning on transistors 622 and 625 (FIG. 6) to form a current path between nodes 640 and 641. Subtracting an inverter in a stage among stages 501 through 505 can include turning off transistors 622 and 625 to disconnect (e.g., not to form) a current path between nodes 640 and 641.

Figure 7:
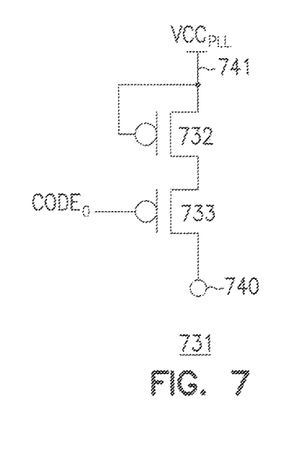
FIG. 7 shows a schematic diagram of a capacitor that can be included in the DCO of FIG. 5, according to some embodiments described herein.

FIG. 7 shows a schematic diagram of a capacitor 731 that can be included in DCO 511 of FIG. 5, according to some embodiments described herein. Capacitor 731 can be included in each of capacitive loads 531 of FIG. 5. Capacitor 731 can be a semiconductor-based capacitor. For example, capacitor 731 can be formed by transistors (e.g., p-channel transistors) 732 and 733 coupled in ways shown in FIG. 7. The gate and source of transistor 732 can be coupled to each other, such that transistor 732 is non-conducting in DC (direct current) signaling. Transistor 733 can be controlled by a signal $CODE_0$ that can include value of a bit among bits of information CODE (FIG. 5).

As shown in FIG. 7, transistors 732 and 733 can be coupled between a node (e.g., supply node) 740 and a node 741. Node 740 can be coupled to an output of an inverter of DCO 511, such as the output of one of inverters 521 of FIG. 5. Node 741 can receive a voltage $VCC_{PLL}$ (e.g., supply voltage), which can be provided by a voltage generator, such as voltage generator 120 of FIG. 1. Thus, voltage $VCC_{PLL}$ at node 741 is an adjustable supply voltage, which can be adjusted (e.g., increased or decreased) based on digital information, such as information CODE (FIG. 5).

As described above with reference to FIG. 5, tuning the frequency of the $f_{OUT}$ signal to a target frequency, keeping the frequency of the $f_{OUT}$ signal at frequency within band frequency range 201 of FIG. 2, or both, can include adding or subtracting the number of capacitors in one or more of capacitive loads 531. In FIG. 7, when capacitor 731 is included in capacitive loads 531 in FIG. 5, adding (or subtracting) a capacitor in one or more of capacitive loads 531 can include controlling (e.g., increasing or decreasing) the capacitance of capacitor 731. For example, in operation, when signal $CODE_0$ is provided with a logic 0 value, transistor 733 is conducting. However, there may be no DC current because the gate to source voltage (Vgs) of transistor 732 is zero. When transistor 733 is conducting, the channel capacitance and diffusion capacitances (both source and drain) of transistor 733 and diffusion capacitance of 732 are visible to node 740, which is coupled to an internal node (e.g., to an output of an inverter) of DCO 511. When signal $CODE_0$ is provided with a logic 1 value, transistor 733 is non-conducting. Thus, the only capacitance visible at node 740 is the drain diffusion capacitance of transistor 733. Therefore, as described herein, the capacitance of capacitor 731 can be digitally controlled.

Figure 8:
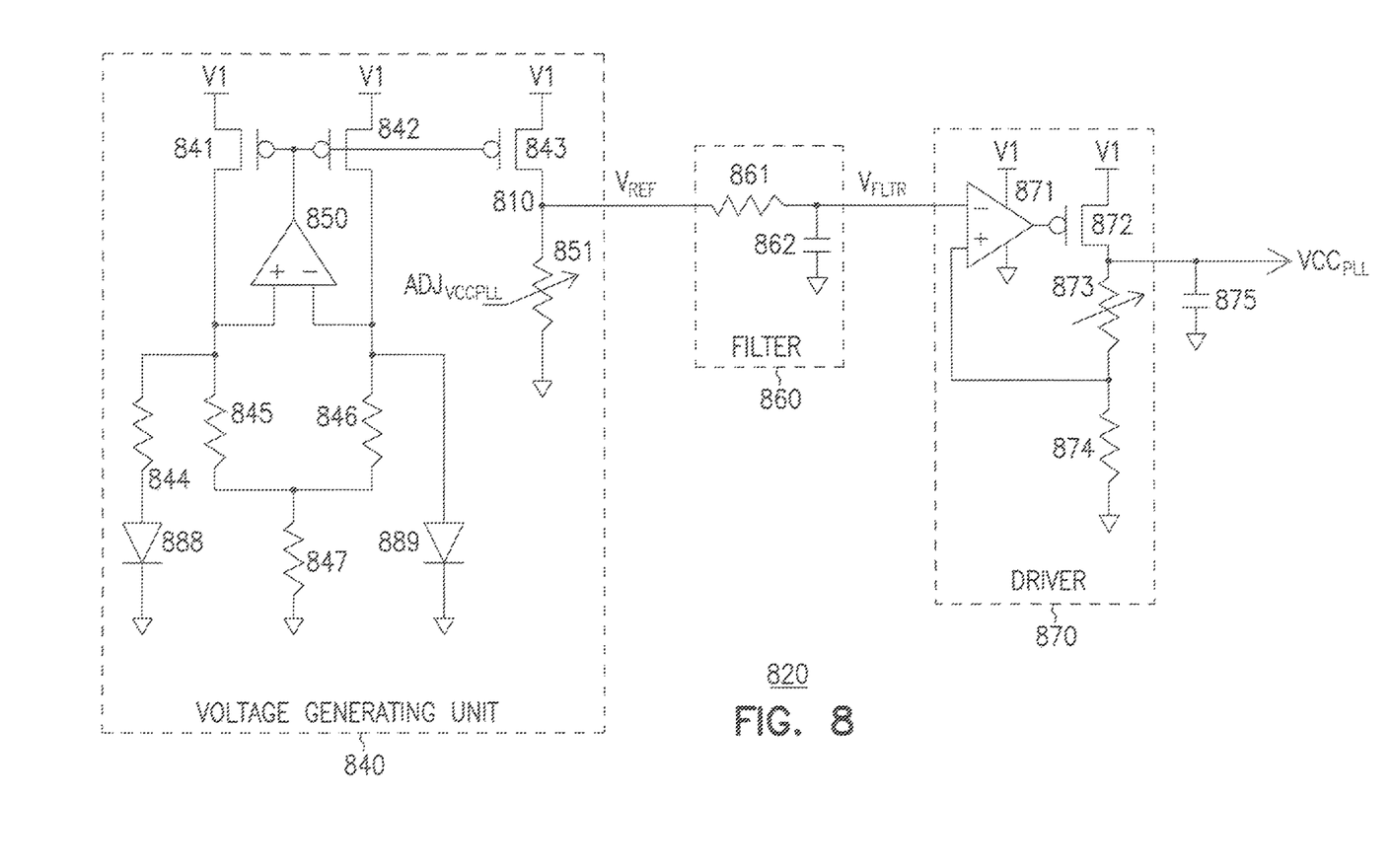
FIG. 8 shows a voltage generator including a bandgap reference voltage generator, according to some embodiments described herein.

FIG. 8 shows a voltage generator 820 including a bandgap reference voltage generator, according to some embodiments described herein. Voltage generator 820 can be used as voltage generator 120 of FIG. 1 to provide voltage $VCC_{PLL}$ to PLL 110. Voltage generator 820 can include a voltage generating unit 840 (which is a bandgap reference voltage generator) to generate a voltage e.g., reference voltage) $V_{REF}$ at a node 810. Voltage $V_{REF}$ can be considered as bandgap reference voltage. Voltage generator 820 can include a filter 860 to generate a voltage $V_{FLTR}$, which is a filtered version of voltage $V_{REF}$, and a driver 870 to drive a voltage $VCC_{PLL}$. Driver 870 can operate to as voltage regulator to keep voltage $VCC_{PLL}$ at a specific value relative to the value of $V_{REF}$. Voltage generator 820 can operate at a voltage V1 (e.g., a supply voltage of voltage generator 820). The value of voltage V1 can be greater than the value of voltage $VCC_{PLL}$.

Voltage generating unit 840 can include transistors p-channel transistors) 841, 842, and 843, resistors 844, 845, 846, and 847, diodes 888 and 889, an amplifier 850, and a resistor 851. Resistor 851 can include an adjustable (e.g., variable) resistor having a resistance value based on a value of information $ADJ_{VCCPLL}$. Information $ADJ_{VCCPLL}$ can have different values. Each of the values of information $ADJ_{VCCPLL}$ can cause resistor 851 to have a different resistance value. A different value of resistor 851 can cause voltage $V_{REF}$ to have a different value. Thus, the value of voltage $V_{REF}$ can be adjusted by selecting appropriate value of information $ADJ_{VCCPLL}$.

As mentioned above, voltage generator 820 can be used as voltage generator 120 of FIG. 1 to provide voltage $VCC_{PLL}$ to PLL 110. Thus, the value of information $ADJ_{VCCPLL}$ can be adjusted based on a monitor of the value of information CODE of PLL 110. Each value of information $ADJ_{VCCPLL}$ may adjust the value of voltage $V_{REF}$ by a voltage amount. Since voltage $VCC_{PLL}$ (FIG. 8) is generated based on voltage $V_{REF}$, adjusting the value of voltage $V_{REF}$ also adjusts the value of voltage $VCC_{PLL}$.

Filter 860 can include a resistor 861 and a capacitor 862 arranged to operate as an RC filter, which can filter (e.g., reduce or eliminate) noise that may occur in voltage $V_{REF}$. Voltage $V_{FLTR}$ provided at the output of filter 860 is a filtered version (e.g., clean version) of voltage $V_{REF}$. The values resistor 861 and capacitor 862 can be selected, such that filter 860 may operate at a frequency at less the frequency of PLL 110. This may allow a change in voltage $VCC_{PLL}$ to occur after a time delay (e.g., 2.5 microseconds caused by filter 860) from the time that voltage $V_{REF}$ changes, in which such a time delay can be slow enough to prevent any glitches or jitter in PLL 110 when voltage $VCC_{PLL}$ changes.

Driver 870 can include an amplifier 871, a transistor (e.g., p-channel transistor) 872, and resistors 873 and 874. Resistor 873 can include an adjustable resistor (e.g., trimming resistor), which can be adjusted to select the value for voltage $VCC_{PLL}$ based on the value of voltage $V_{REF}$. After the value of resistor 873 is selected, it can remain fixed at the selected value during operation of voltage generator 820. Voltage generator 820 can also include a capacitor 875 arranged with driver 870 to filter voltage $VCC_{PLL}$, so that current and voltage $VCC_{PLL}$ provided by voltage generator can be noise-free (or substantially noise-free) voltage.

Voltage generator 820 can operate at an operating frequency that is less than the operating frequency of PLL 110. For example, the value of resistor 861 and capacitor 862 can be selected such that voltage generator 820 can operate at a frequency F2 (e.g., approximately 500 Khz to 1 Mhz). DCO 111 of PLL 110 can operate at a frequency F1 (e.g., approximate 5 Mhz) that is greater than frequency F2. Thus, when voltage generator 820 is used as voltage generator 120 in control loop 102 of FIG. 1, the operating frequency (e.g., F2) of control loop 102 can be less than the operating frequency (e.g., F1) of control loop 101 (which includes DCO 111).

As mentioned above, voltage $V_{REF}$ can be considered as a bandgap reference voltage. This bandgap reference voltage can be based in part on the characteristics and operations of diodes 888 and 889. Normally, voltage $V_{REF}$ may be temperature independent. However, in some situations (e.g., due to manufacturing process variations, defects, or other causes) some components (e.g., one or both of diodes 888 and 889) of unit 840 may not operate according to designed specification. When such situations occur, voltage $V_{REF}$ may become temperature dependent. For example, the value of voltage $V_{REF}$ may change (e.g., decrease) from its normal (e.g., specified) range when temperature changes (e.g., increases). Since voltage $VCC_{PLL}$ is generated based on voltage $V_{REF}$, the value of voltage $VCC_{PLL}$ also changes when the value of voltage $V_{REF}$ changes.

As also mentioned above, voltage $VCC_{PLL}$ generated by a voltage generator voltage generator 820) can be used as supply voltage for PLL 110 of FIG. 1. Thus, if the value of voltage $VCC_{PLL}$ changes (e.g., due to a change in value of voltage $V_{REF}$ as described above), band frequency range 201 (FIG. 2) of the $f_{OUT}$ signal may be affected (e.g., the frequency of the $f_{OUT}$ signal may drift). Therefore, if the value of voltage $VCC_{PLL}$ is improperly controlled (e.g., is not adjusted if voltage $V_{REF}$ becomes temperature dependent), PLL 110 may potentially becoming unlocked if the value of information CODE approaches a certain value (e.g., value $CODE_{X1}$ in FIG. 3 or value $COD_{X4}$ in FIG. 4) near the edges (e.g., near value $CODE_{MIN}$ or information $CODE_{MAX}$) of banding range 202.

Including voltage generator 820 in control loop 102 (FIG. 1) may prevent PLL 110 from potentially becoming unlocked in some situations (e.g., in a situation where voltage $V_{REF}$ becomes temperature dependent). For example, in voltage generator 820 of FIG. 8, the value of voltage $VCC_{PLL}$ can be adjusted by monitoring the value of information CODE (FIG. 1). Then, the value of information $ADJ_{VCCPLL}$ can be adjusted based on the monitored value of information CODE in order to cause the value of voltage $VCC_{PLL}$ to be adjusted. Thus, when voltage generator 820 is included in control loop 102 in FIG. 1, control loop 102 can operate as a feedback loop (e.g., analog feedback loop) to adjust the value of $VCC_{PLL}$ in order to prevent PLL 110 from potentially becoming unlocked if the value of information CODE approaches a certain value near the edges of banding range 202 (FIG. 2).

Adjusting the value of voltage $VCC_{PLL}$ based on the value of information CODE, as described above, may also reduce (e.g., compensate) the effect of other factors on PLL 110 that may also cause PLL 110 to potentially becoming unlocked. Examples of such factors include the accuracy of information CODE itself and temperature dependency of DCO 111.

Figure 9:
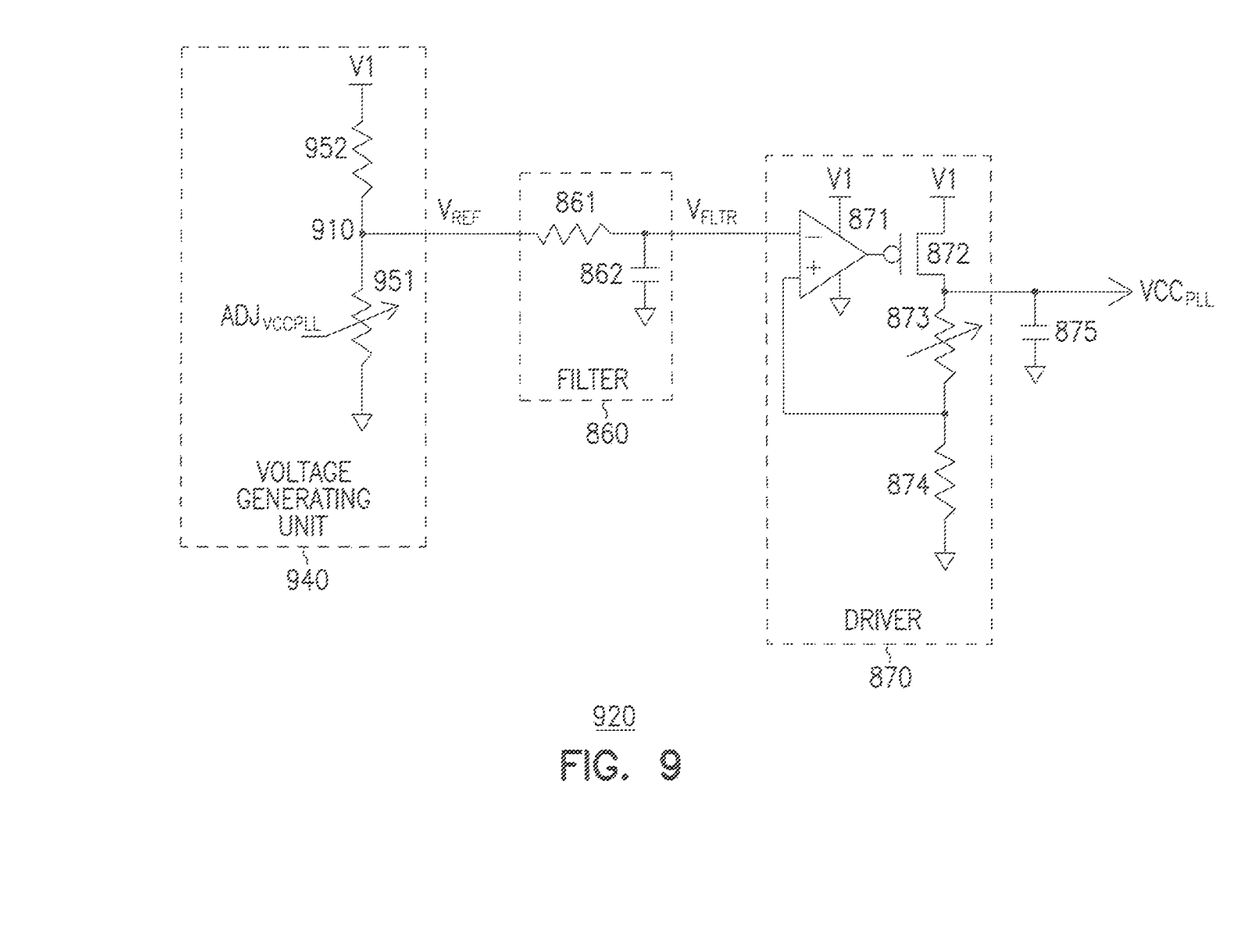
FIG. 9 shows a voltage generator including an adjustable resistor divider, according to according to some embodiments described herein.

FIG. 9 shows a voltage generator 920 including an adjustable resistor divider, according to according to some embodiments described herein. Voltage generator 920 can be used as voltage generator 120 of FIG. 1. Voltage generator 920 includes elements similar to, or identical to, those of voltage generator 820 of FIG. 8. For simplicity, similar or identical elements between voltage generators 820 and 920 are not repeated in the description of FIG. 9. Differences between voltage generators 820 and 920 include differences between voltage generating units 840 (FIG. 8) and 940 (FIG. 9).

As shown in FIG. 9, voltage generating unit 940 can include resistors 951 and 952 that form an adjustable resistor divider to provide a voltage $V_{REF}$ at a node 910. The value of voltage $V_{REF}$ at node 910 can be based on a value of voltage V1 and the value of resistors 951 and 952. Resistor 951 is an adjustable (e.g., variable) resistor that can operate in ways similar to identical to those of resistor 851 of FIG. 8. The value of information $ADJ_{VCCPLL}$ can be adjusted in order to adjust the resistance value of resistor 951, thereby adjusting the value of voltage $V_{REF}$. As described above with reference to FIG. 8, the value of information $ADJ_{VCCPLL}$ can be adjusted based on the value of information CODE of PLL 110 (FIG. 1). Since voltage $VCC_{PLL}$ is generated based on voltage $V_{REF}$, adjusting the value of voltage $V_{REF}$ also adjusts the value of voltage $VCC_{PLL}$. This may to prevent PLL 110 from potentially becoming unlocked in some situations, as described above with reference to FIG. 8.

Figure 10:
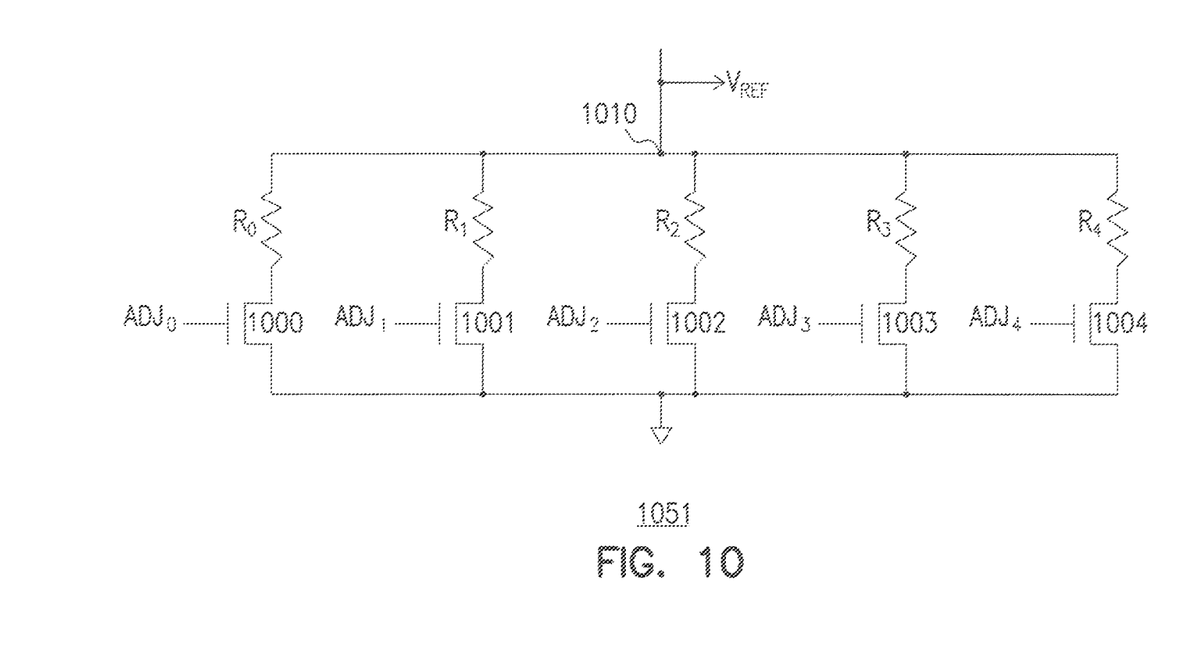
FIG. 10 shows an adjustable resistor, according to some embodiments described herein.

FIG. 10 shows an adjustable resistor 1051, according to some embodiments described herein. Adjustable resistor 1051 can be used as resistor 851 of FIG. 8 and resistor 951 of FIG. 9. As shown in FIG. 10, adjustable resistor 1051 can include resistors $R_0$ through $R_4$ and switches (e.g., in the form of transistors) 1000 through 1004. Resistors to $R_0$ through $R_4$ can be coupled to a node 1010, which can correspond to node 810 of FIG. 8 or node 910 of FIG. 9. Thus, voltage $V_{REF}$ provided at node 1010 can correspond to voltage $V_{REF}$ provided at node 810 of FIG. 8 or voltage $V_{REF}$ provided at node 910 of FIG. 9.

In FIG. 10, the value of voltage $V_{REF}$ can be based on a resistance value between node 1010 and ground. Such a resistance value can be the resistance value of one of resistor among resistors $R_0$ through $R_4$ or the resistance value from a parallel combination of two or more resistors among resistors $R_0$ through $R_4$. Switches 1000 to 1004 can be controlled (e.g., turned on or off) by corresponding signals $ADJ_0$ through $ADJ_4$ to select resistance value between node 1010 and ground. For example, if switches 1000 through 1003 are turned on and switch 1004 is turned off then the resistance value between node 1010 and ground can be calculated from the parallel combination resistors $R_0$ through $R_3$. Each of the $ADJ_0$ through $ADJ_4$ signals can include a value of a bit among bits of information $ADJ_{VCCPLL}$ of FIG. FIG. 8 or FIG. 9. As described above with reference to FIG. 1 through FIG. 4, FIG. 8, and FIG. 9, the value of information $ADJ_{VCCPLL}$ and can be selected based on information CODE of PLL 110 of FIG. 1.

Figure 11:
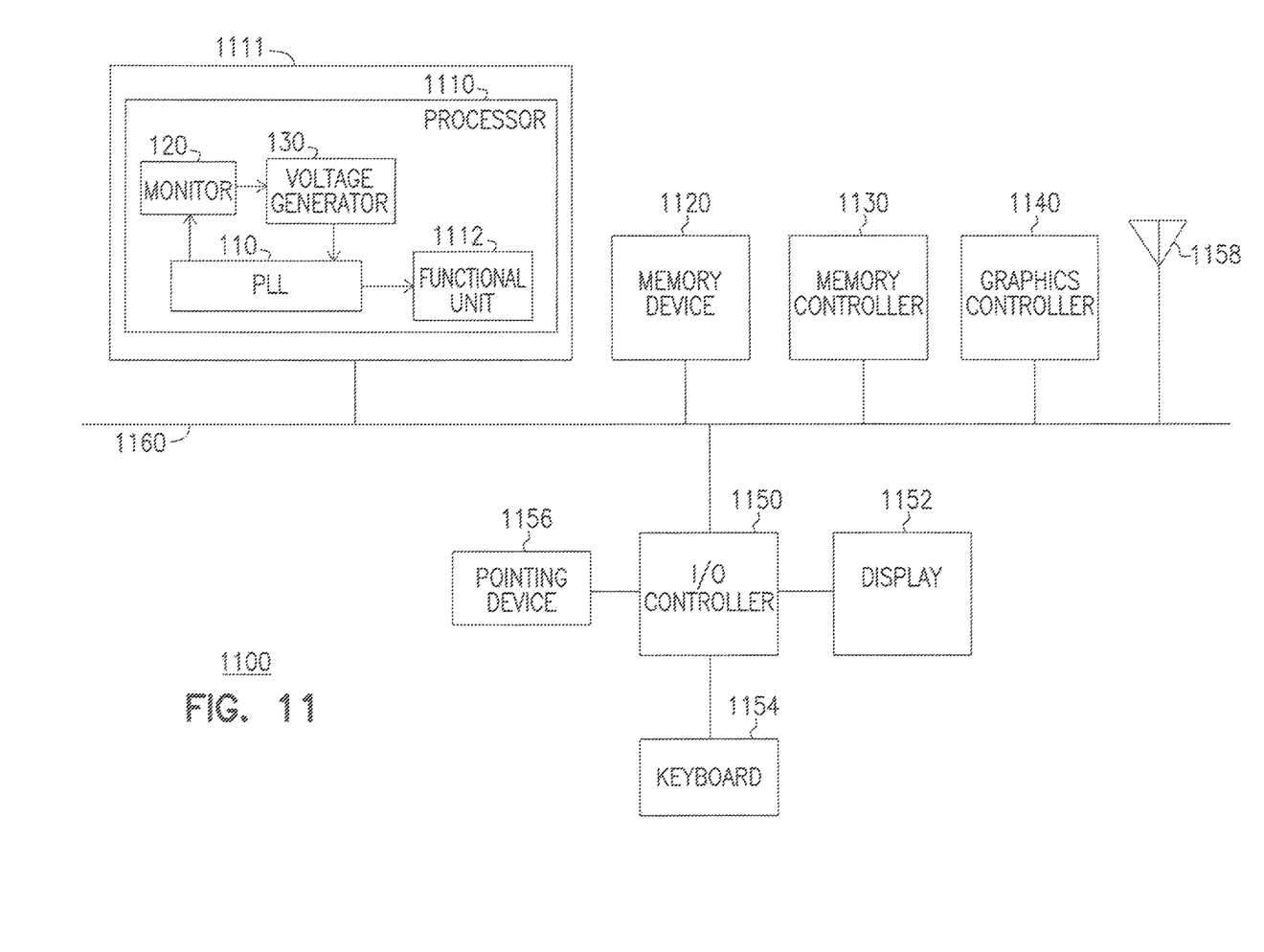
FIG. 11 shows an apparatus in the form of an electronic system, according to some embodiments described herein.

FIG. 11 shows an apparatus in the form of a system (e.g., electronic system) 1100, according to some embodiments described herein. System 1100 can include or be included in a computer, a cellular phone, or other electronic system. As shown in FIG. 11, system 1100 can include a processor 1110, a memory device 1120, a memory controller 1130, a graphics controller 1140, an input and output (I/O) controller 1150, a display 1152 (e.g., liquid crystal display, a touch screen, or another type of display), a keyboard 1154, a pointing device 1156, at least one antenna 1158, and a bus 1160.

Processor 1110 may be a general-purpose processor or an application specific integrated circuit (ASIC). Processor 1110 can be located on (e.g., formed on or formed in) a die (e.g., semiconductor die) 1111. Processor 1110 can include PLL 110, voltage generator 120, and monitor 130. The $f_{OUT}$ signal from PLL 110 can be used as a clock signal by one or more components (e.g., functional unit 1112) of processor 1110.

Memory device 1120 may be a dynamic random access memory (DRAM) device, a static random access memory (SRAM) device, a flash memory device, or a combination of these memory devices. FIG. 11 shows an example where memory device 1120 is a stand-alone memory device separated from processor 1110. In an alternative arrangement, memory device 1120 and processor 1110 can be located on the same die (e.g., die 1111). In such an alternative arrangement, memory device 1120 is an embedded memory in processor 1110, such as embedded DRAM (eDRAM), embedded SRAM (eSRAM), embedded flash memory, or another type of embedded memory.

I/O controller 1150 can include a communication module for wired or wireless communication e.g., communication through one or more antenna. 1158). Display 1152 can include a liquid crystal display (LCD), a touchscreen (e.g., capacitive or resistive touchscreen), or another type of display. Pointing device 1156 can include a mouse, a stylus, or another type of pointing device.

FIG. 11 shows the components of system 1100 are arranged separated from each other as an example. In some arrangements, two or more components (processor 1110, memory device 1120, and I/O controller 1150) of system 1100 can be located on the same die (e.g., same IC chip) that forms a system-on-chip (SoC).

Figure 12:
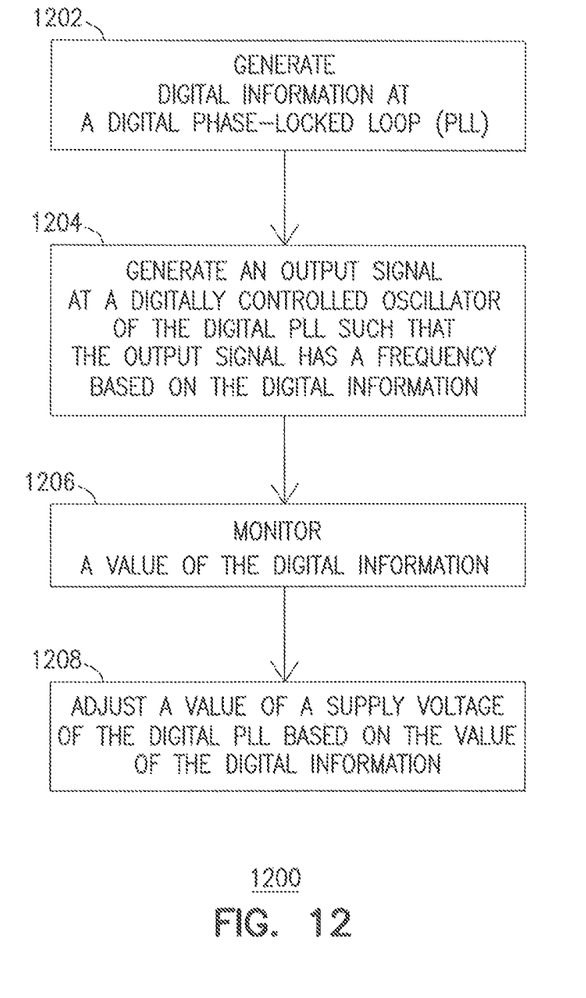
FIG. 12 is flowchart showing a method of operating a digital PLL, according to some embodiments described herein.

FIG. 12 is flowchart showing a method 1200 of operating a digital PLL, according to some embodiments described herein. The digital PLL used in method 1200 can include PLL 110 described above with reference to FIG. 1 through FIG. 11.

As shown in FIG. 12, activity 1202 can include generating digital information (e.g., information CODE in FIG. 1) at the digital PLL.

Activity 1204 can include generating an output signal (e.g., $f_{OUT}$) at a DCO of the digital PLL, such that the output signal has a frequency based on the digital information.

Activity 1206 can include monitoring a value of the digital information.

Activity 1208 can include adjusting a value of a supply voltage (e.g., $VCC_{PLL}$ in FIG. 1) of the digital PLL based on the value the digital information. For example, activity 1208 can include decreasing the value of the supply voltage if the value of the digital information is less than a lower limit (e.g., $CODE_{LOWER}$ in FIG. 2) of a value range of the digital information. In another example, activity 1208 can include increasing the value of the supply voltage if the value of the digital information is greater an upper limit (e.g., $CODE_{UPPER}$ in FIG. 2) of the value range of the digital information.

Method 1200 can include fewer or more activities than activities 1202 through 1208 shown in FIG. 12. For example, method 1200 can include activities and operations of apparatus 100 and system 1100, described above with reference to FIG. 1 through FIG. 11.

The illustrations of the apparatuses (e.g., apparatus 100 and system 1100) and methods (e.g., operations of apparatus 100 and system 1100, and method 1200) are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc., set top boxes, and others.

ADDITIONAL NOTES AND EXAMPLES

Example 1 includes subject matter (such as a device, apparatus, or machine) including a digitally controlled oscillator to generate an output signal having a frequency based on a value of a digital information, and a control loop to adjust a value of a supply voltage of the digitally controlled oscillator based on the value the digital information.

In Example 2, the subject matter of Example 1 may optionally include, wherein the control loop is arranged (e.g., configured) to adjust the value of the supply voltage if the value the digital information is outside a value range.

In Example 3, the subject matter of Example 2 may optionally include, wherein digital information has a minimum value and a maximum value, and the value range of the digital information has lower limit greater than the minimum value and an upper limit less than the maximum value.

In Example 4, the subject matter of Example 3 may optionally include, wherein the value range of the digital information is associated with a portion of a frequency range of the output signal.

In Example 5, the subject matter of Example 1 may optionally include, wherein the control loop includes a monitor to monitor the value of the digital information and generate information based on the value of the digital information, and a voltage generator to generate the supply voltage and to adjust the value of the supply voltage based on the information generated by the monitor.

In Example 6, the subject matter of Example 5 may optionally include, wherein the voltage generator includes a voltage generating unit to generate a voltage, a filter to generate a filtered voltage from the voltage, and a driver to provide the supply voltage based on the filtered voltage.

In Example 7, the subject matter of any one of Example 6 may optionally include, wherein the voltage generating unit includes a bandgap reference generator to generate the voltage.

In Example 8, the subject matter of any one of Example 7 may optionally include, wherein the bandgap reference generator includes an adjustable resistor having a resistance value based on the value of the digital information, and the value of the voltage is based at least in part on the resistance value.

In Example 9, the subject matter of any one of Example 6 may optionally include, wherein the voltage generating unit includes an adjustable resistor divider to generate the voltage.

In Example 10, the subject matter of any one of Example 9 may optionally include, wherein the adjustable resistor divider includes an adjustable resistor having a resistance value based on the value of the digital information.

Example 11 includes subject matter (such as a device, apparatus, or machine) including a digitally controlled oscillator in a digital phase-locked loop to generate an output signal, a first control loop to generate a digital information to control a frequency of the digitally controlled oscillator, and a second control loop to adjust a value of a supply voltage provided to the digitally controlled oscillator if the value the digital information is outside a value range.

In Example 12, the subject matter of any one of Example 11 may optionally include, wherein the digitally controlled oscillator includes inverting stages arranged in a ring arrangement, and capacitive loads coupled to the inverting stages, each of the capacitor loads having a capacitance value based on the value of the digital information.

In Example 13, the subject matter of any one of Example 11 may optionally include, wherein the first control loop includes a time-to-digital converter to generate a digital representation of the output signal, a phase frequency detector to compare the digital representation of the output signal with a digital representation of a reference signal and generate a result, and a digital filter to generate the digital information based on the result.

In Example 14, the subject matter of Example 11 may optionally include, wherein the second control loop is arranged (e.g., configured) to decrease the value of the supply voltage if the value of the digital information is less than a value of a lower limit of the value range.

In Example 15, the subject matter of Example 11 may optionally include, wherein the second control loop is arranged (e.g., configured) to increase the value of the supply voltage if the value of the digital information is greater than a value of an upper limit of the value range.

In Example 16, the subject matter of Example 11 may optionally include, wherein the second control loop includes a bandgap reference generator to generate a bandgap reference voltage, an RC filter to receive the bandgap reference voltage and generate a filtered voltage, and a driver to receive the filtered voltage and provide the supply voltage.

In Example 17, the subject matter of Example 11 may optionally include, wherein the second control loop includes an adjustable resistor divider to generate a voltage, an RC filter to receive the voltage and generate a filtered voltage, and a driver to receive the filtered voltage and provide the supply voltage.

In Example 18, the subject matter of Example 11 may optionally include, where the second control loop is arranged to operate at a frequency less than a frequency of the first control loop.

Example 19 includes subject matter (such as a system, apparatus, or machine) including a memory device, and a processor coupled to the memory device, the processor including a digital phase-locked loop including a digital controlled oscillator to generate an output signal having a frequency based on a value of a digital information, and a control loop to adjust a value of a supply voltage provided to the digitally controlled oscillator if the value the digital information is outside a value range.

In Example 20, the subject matter of Example 19 may optionally include, wherein the memory device and the processor are located on a same die.

In Example 21, the subject matter of Example 19 may optionally include, wherein the control loop includes a bandgap reference generator to generate a bandgap reference voltage, and a driver to provide the supply voltage based on the bandgap reference voltage to the digitally controlled oscillator.

In Example 22, the subject matter of Example 21 may optionally include, wherein the bandgap reference generator is arranged to receive an additional digital information to control the value of the bandgap reference voltage.

Example 23 includes subject matter including a method of operating a digital phase-locked loop, the method including generating a digital information at a digital phase-locked loop, generating an output signal at a digitally controlled oscillator of the digital phase-locked loop, such that the output signal has a frequency based on the digital information, monitoring a value of the digital information, and adjusting a value of a supply voltage of the digital phase-locked loop if the value the digital information is outside a value range.

In Example 24, the subject matter of Example 23 may optionally include, further comprising bringing the value of the digital information inside the value range after the value of the supply voltage is adjusted.

In Example 25, the subject matter of Example 23 may optionally include, wherein adjusting the value of the supply voltage includes at least one of decreasing the value of the supply voltage if the value of the digital information is less than a lower limit of the value range, and increasing the value of the supply voltage if the value of the digital information is greater than an upper limit of the value range.

The subject matter of Example 1 through Example 25 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   a voltage generator to generate a voltage;
   a circuit to generate output signal having a frequency based on a value of a digital information in a first control loop; and
   a monitor in a second control loop to monitor the value of the digital information and to decrease a value of the voltage if the value of the digital information is less than a value of a lower limit of the value range, and to increase the value of the voltage if the value of the digital information is greater than a value of an upper limit of the value range, wherein the second control loop is arranged to operate at a frequency less than a frequency of the first control loop.

2. The apparatus of claim 1, wherein the voltage generator includes a bandgap reference generator to generate a reference voltage and the voltage is generated based on the reference voltage.

3. The apparatus of claim 2, wherein the bandgap reference generator includes an adjustable resistor having a resistance value based on the value of the digital information, and the value of the reference voltage is based at least in part on the resistance value.

4. An apparatus comprising:
   a voltage generator to generate a voltage;
   a circuit to generate output signal having a frequency based on a value of a digital information in a first control loop; and
   a monitor in a second control loop to monitor the value of the digital information and to adjust the value of the voltage based on the value of the digital information, wherein the voltage generator includes a bandgap reference generator to generate a reference voltage, and a filter to generate a filtered voltage based on the reference voltage, and the voltage is generated based on the filtered voltage, wherein the second control loop is arranged to operate at a frequency less than a frequency of the first control loop.

5. The apparatus of claim 1, wherein the voltage generating unit includes an adjustable resistor divider to generate the voltage at a node of the voltage divider.

6. The apparatus of claim 5, wherein the adjustable resistor divider includes an adjustable resistor having a resistance value based on the value of the digital information.

7. An apparatus comprising:
   a voltage generator to generate a voltage;
   a circuit to generate output signal having a frequency based on a value of a digital information in a first control loop; and
   a monitor in a second control loop to monitor the value of the digital information and to adjust the value of the voltage based on the value of the digital information, wherein the monitor is to adjust the value of the supply voltage if the value of the digital information is outside a value range, and the value range of the digital information has lower limit greater than a minimum value of the digital information and an upper limit less than a maximum value of the digital information, wherein the second control loop is arranged to operate at a frequency less than a frequency of the first control loop.

8. The apparatus of claim 7, wherein the value range of the digital information is associated with a portion of a frequency range of the output signal.

9. An apparatus comprising:
   a digitally controlled oscillator to receive a supply voltage and to generate an output signal;
   a first control loop to generate a digital information to control a frequency of the digitally controlled oscillator; and
   a second control loop to decrease the value of the supply voltage if the value of the digital information is less than a value of a lower limit of the value range, and to increase the value of the supply voltage if the value of the digital information is greater than a value of an upper limit of the value range, wherein the second control loop is arranged to operate at a frequency less than a frequency of the first control loop.

10. The apparatus of claim 9, wherein the digitally controlled oscillator includes inverting stages arranged in a ring arrangement.

11. The apparatus of claim 9, wherein the digitally controlled oscillator includes capacitive loads coupled to the inverting stages, each of the capacitor loads having a capacitance value based on the value of the digital information.

12. The apparatus of claim 9, wherein the first control loop includes a time-to-digital converter to generate a digital representation of the output signal.

13. The apparatus of claim 12, wherein the first control loop includes a phase frequency detector to compare the digital representation of the output signal with a digital representation of a reference signal and generate a result, and a digital filter to generate the digital information based on the result.

14. The apparatus of claim 9, wherein the second control loop includes a bandgap reference generator to generate a bandgap reference voltage, wherein the supply voltage is generated based on the bandgap reference voltage.

15. The apparatus of claim 9, wherein the second control loop includes:
   an adjustable resistor divider to generate a voltage;
   an RC filter to receive the voltage and generate a filtered voltage; and
   a driver to receive the filtered voltage and provide the supply voltage.

16. A system comprising:
   memory device; and
   a processor coupled to the memory device, the processor including:
   a voltage generator to generate a supply voltage;

a circuit to generate output signal having a frequency based on a value of a digital information in a first control loop; and a monitor in a second control loop to monitor the value of the digital information and to decrease a value of the supply voltage if the value of the digital information is less than a value of a lower limit of the value range, and to increase the value of the supply voltage if the value of the digital information is greater than a value of an upper limit of the value range, wherein the second control loop is arranged to operate at a frequency less than a frequency of the first control loop.

17. The system of claim 16, wherein the memory device and the processor are located on a same die.

18. The system of claim 16, wherein the control loop includes a bandgap reference generator to generate a bandgap reference voltage, and a driver to provide the supply voltage based on the bandgap reference voltage to the digitally controlled oscillator.

* * * * *